(12) United States Patent
Faust et al.

(10) Patent No.: US 7,713,089 B2
(45) Date of Patent: May 11, 2010

(54) PHOTOVOLTAIC ROOFING TILE WITH A PLUG AND SOCKET ON 2 OPPOSITE EDGES

(75) Inventors: Thomas Faust, Corte Madera, CA (US); Jonathan Carter Hebert, Durango, CO (US); Osbert Cheung, Concord, NC (US)

(73) Assignee: Redwood Renewable, LLC

( * ) Notice: Subject to any disclaimer, the term of this patent is extended or adjusted under 35 U.S.C. 154(b) by 0 days.

(21) Appl. No.: 12/389,664

(22) Filed: Feb. 20, 2009

(65) Prior Publication Data
US 2009/0215304 A1 Aug. 27, 2009

Related U.S. Application Data

(60) Provisional application No. 61/066,813, filed on Feb. 22, 2008.

(51) Int. Cl.
*H01R 13/66* (2006.01)
*H02N 6/00* (2006.01)
*H01L 31/42* (2006.01)

(52) U.S. Cl. .................................. 439/620.21; 136/251
(58) Field of Classification Search ............ 439/620.21, 439/620.22, 358, 281–282; 136/244, 251
See application file for complete search history.

(56) References Cited

U.S. PATENT DOCUMENTS

| 7,387,537 | B1* | 6/2008 | Daily et al. | 439/620.22 |
|---|---|---|---|---|
| 7,445,508 | B2* | 11/2008 | Daily et al. | 439/620.22 |
| 7,625,238 | B2* | 12/2009 | Duesterhoeft | 439/620.22 |
| 2008/0110488 | A1* | 5/2008 | Buller et al. | 136/244 |
| 2008/0149170 | A1* | 6/2008 | Hanoka | 136/251 |

* cited by examiner

*Primary Examiner*—Chandrika Prasad
(74) *Attorney, Agent, or Firm*—John Bargero (57) ABSTRACT

A low profile integrated solar roofing tile connecting system for the formation of a solar roof. The system is aesthetically appealing because the tiles lay relatively flat with a very low profile without any bulges or ridges because all wires and connectors embedded in the tiles. This low profile optimizes the roof's ability to withstand wind loads as well as minimizes cracking or breaking of the tiles due to external load forces. The connectors produce uniform spaces between adjacent tiles as well as providing an easy way to extend or exchange tiles. An integrated shunting or bypasses diode provides a current shunt path in the event of a modules' impedance upsurge cause by shading or by non-functioning tiles. This also allows for the flexible arrangement of the PV roofing tiles for a variety of system configurations, e.g. grid-tied, and off-grid systems, while maintaining system reliability and a modularized design.

21 Claims, 10 Drawing Sheets

FIG. 9A

PHOTOVOLTAIC ROOFING TILE WITH A PLUG AND SOCKET ON 2 OPPOSITE EDGES

PRIORITY FILING

This application is claiming the filing date of Feb. 22, 2008 of provisional patent application Ser. No. 61/066,813.

BACKGROUND OF THE INVENTION

1. Field of Invention

The invention relates to the field of photovoltaic power (PV) systems design and applications, specifically PV roofing tiles. Additionally, it is foreseeable that this invention can be utilized in other application where low profile connection of electrical panels is desired, such as in flat panel lighting for example. This invention is a low profile electrical interconnect system with an integrated shunting or bypass diode that enables an aesthetic integrated solar tile system to be easily installed on sloped roofs without customized roof decking.

2. Related Art

In the field of solar interconnects the height of the existing interconnects ranges from 13.5 mm to 18.5 mm in height. These plugs have large snap on connectors, screw on locks or ribbed plugs. None of the available plugs have a built in shunting or bypass diode. This condition has blocked the increased use of solar installations on roofs, because the current technology doesn't allow the solar tiles to be aesthetically laid flat on the roofing substrate without significantly increasing the cost of installation with special roof decking. If the tiles are laid flat directly on the roof decking, the existing technology is highly susceptible to tile warping and will not pass a wind test. The best available option for PV roofing tile installations with current technology incorporates an expensive system of roofing batons and frames to allow the PV tiles to be mounted with the system interconnects and wires hanging beneath the modules.

SUMMARY OF THE INVENTION

The invention provides the technology that will enable the expanded use of PV roofing tiles by significantly lowering the cost and improving the aesthetics of system installations. The terminology PV will be used extensively throughout and is to be understood as Photovoltaic or as a solar energy converting cell or simply as solar. This invention is a low profile electrical and interconnection system with plug connectors under 10 mm in height, with a built in shunting or bypass diode and circuit that allows current to be shunted around high impedance PV modules. This system improves on the current technology by reducing the system cost and increasing the system reliability.

The novel integration of a shunting or bypass diode is the cornerstone of a completely integrated PV roofing tile system, thus significantly improving the systems' operation and performance by reducing the effect of a single module's reliability. Without the need for special roof decking the installation cost of the novel low profile shunting PV roofing tile interconnection system is significantly reduced to that of current technology. Maintenance and repair is also improved with the integrated solar tile design, allowing for ease of replacement and repair.

BRIEF DESCRIPTION OF THE DRAWINGS

Taking the following specifications in conjunction with the accompanying drawings will cause the invention to be better understood regarding these and other features and advantages. The specifications reference the annexed drawings wherein.

DETAILED DESCRIPTION OF THE PREFERRED EMBODIMENTS

While describing the invention and its embodiments, various terms will be used for the sake of clarity. These terms are intended to not only include the recited embodiments, but also all equivalents that perform substantially the same function, in substantially the same manner to achieve the same result.

Figure 3:
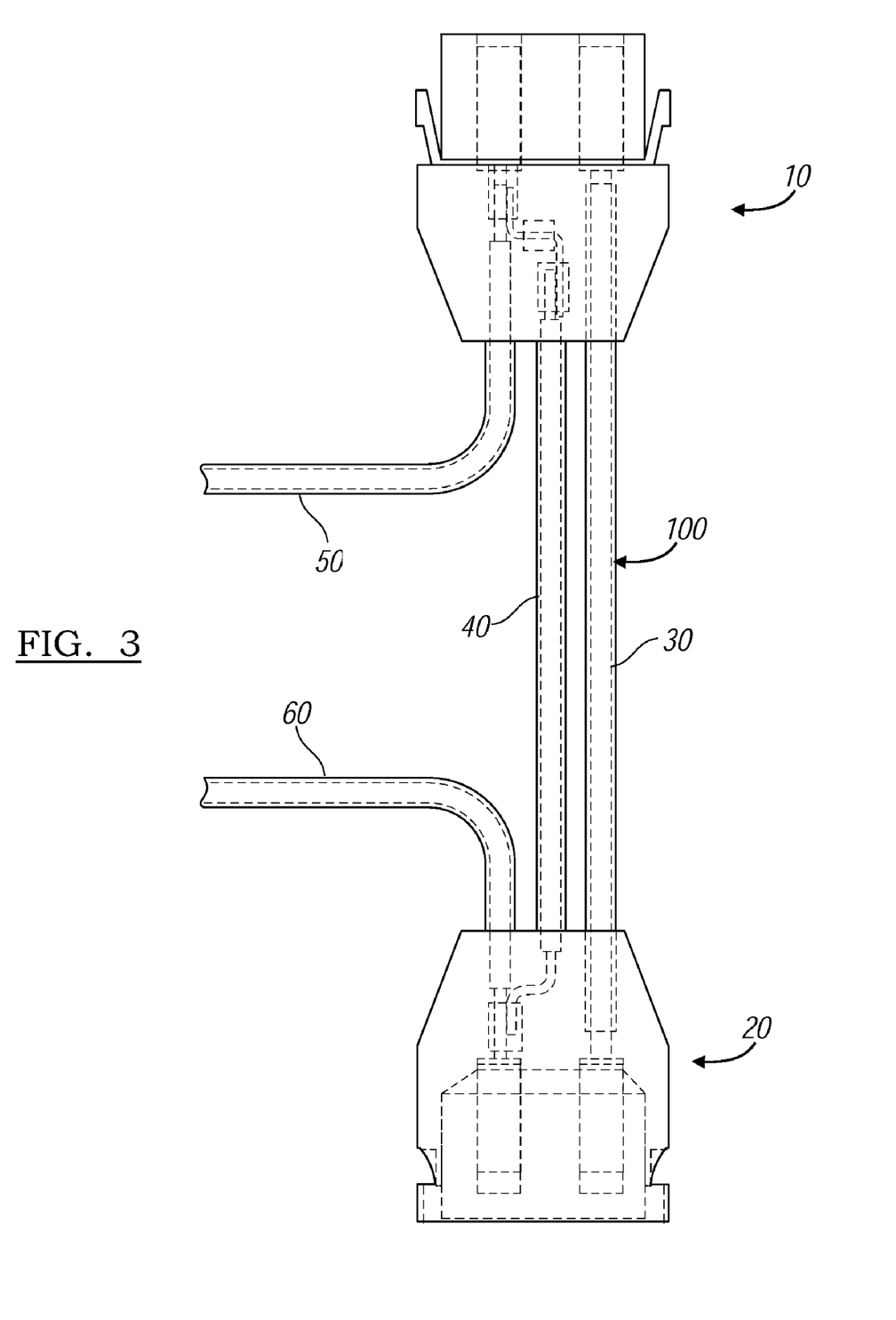
FIG. 3 is a top plan view of the low profile interconnect device.

A preferred embodiment of the present invention discloses a low profile shunting PV interconnection system for use with PV roofing tiles depicted in top plan view in FIG. 3 and indicted generally by the reference number 100 and shall be referenced with the abbreviated terminology as the interconnection system. The interconnection system 100 is comprised of a male interconnect plug 10, a female interconnect socket 20 that are electrically connected by three wires, a return line wire 30, a bypass wire 40, and either the positive solar cell lead wire 50 or the negative solar cell lead wire 60.

Figure 7:
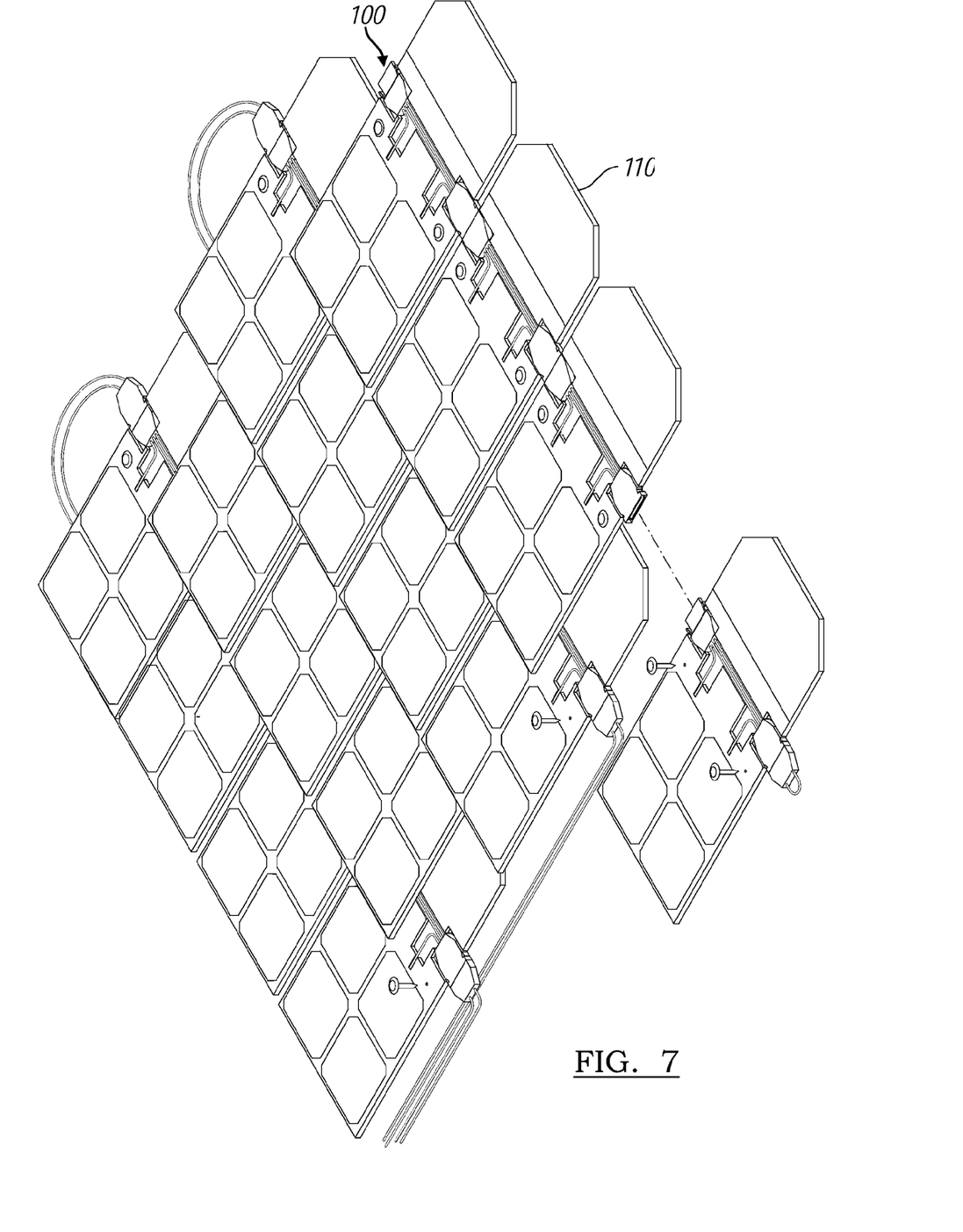
FIG. 7 is a bottom plan view of several solar tiles assembled with the low profile interconnect.

FIG. 7 depicts the bottom plan view of several PV roofing tiles 110. They are water proof and roughly rectangular in shape and have similar geometry of standard roofing tiles with a top portion, a bottom portion, two horizontal side edges, and two vertical side edges. The top portion contains the photovoltaic (PV) or solar cell and is exposed to the elements and sun, while the bottom portion is in direct contact with the building or roof decking. The PV roofing tiles 110 are connected together by the interconnection system 100 to form an array with equally spaced uniform gaps between them.

In one embodiment conventional roofing tiles with PV solar cell affixed to the top portion, that is the part of the tile facing the sun or sky when installed, are used. It has been further contemplated that the non-PV portion of the tile or the tile substrate be comprised of a combination of devulcanized recycled elastomers and polymeric material, EMDP for example, such as suggested in U.S. Pat. No. 6,545,060. The PV roofing tiles 110 arranged in an array fashion, as well as the interconnect system 100, should be view in tandem with FIG. 3 where the wires 30, 40, and 50 or 60 perform the following functions.

The return line wire 30 allows PV roofing tiles 110 to form dynamic array configurations while eliminating exposed wires because the return line wire 30 is coupled with a plurality of PV roofing tiles 110 electrically connected in series. This serves as the closed leg of the circuit at the lowest electrical potential point in the series of PV roofing tiles 110, thus completing the PV power circuit and harvesting solar energy by allowing electrical current to travel form the highest electrical potential point to the lowest simply, safely, and without exposing wires to the elements.

The bypass wire 40 provides a path for current to shunt around the PV roofing tile 110 in the event of a PV roofing tile 110 impedance upsurge, caused by either a PV roofing tile 110 failure or shade on the tile. This characteristic is a function of the novel integration of a shunting or bypass diode 200 in the male interconnect plug 10, which is shown schematically in FIG. 5a.

FIG. 3 depicts the positive solar cell lead wire 50, which is connected to the male interconnect plug 10 and the negative solar cell lead wire 60 which is connected to the female interconnect socket 20. They are routed to the PV cell array on the front side of the PV roofing tile 110 and are effectively the "hot" lines used to connect series PV roofing tiles 110.

Figure 8:
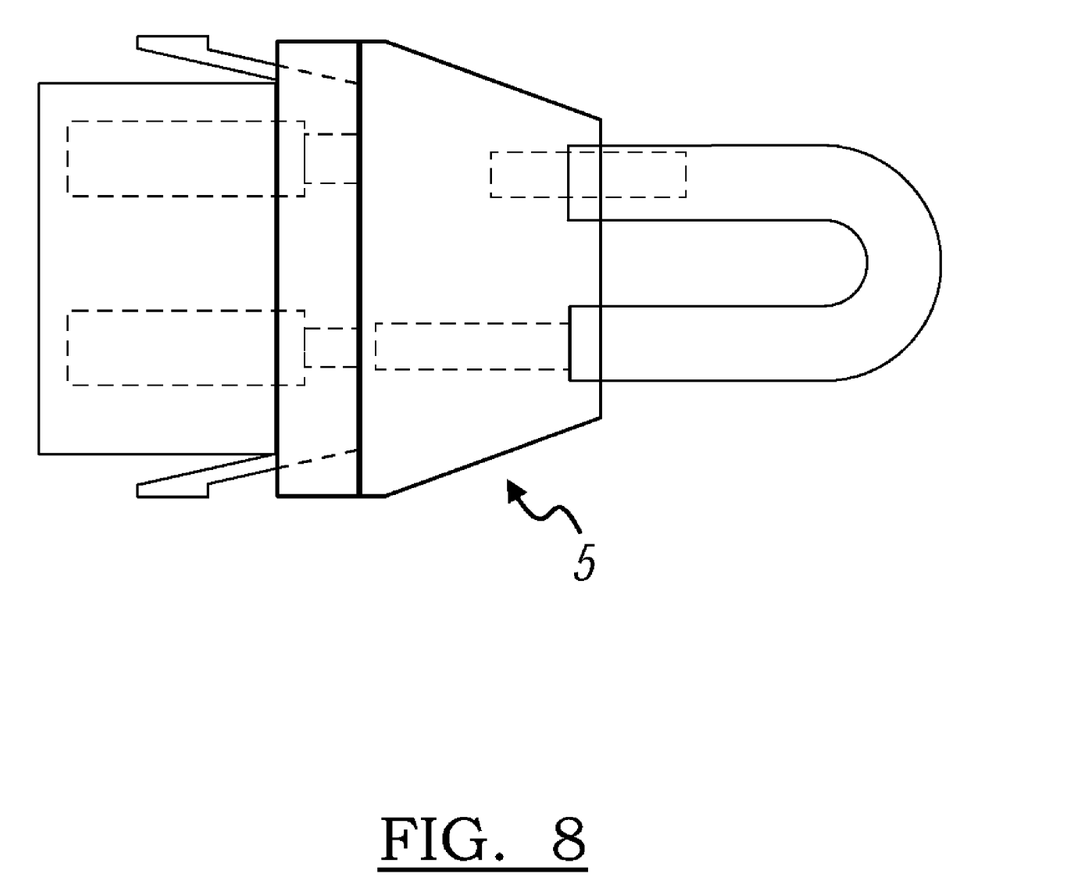
FIG. 8 is a top view of a terminus connector.
Figure 9:
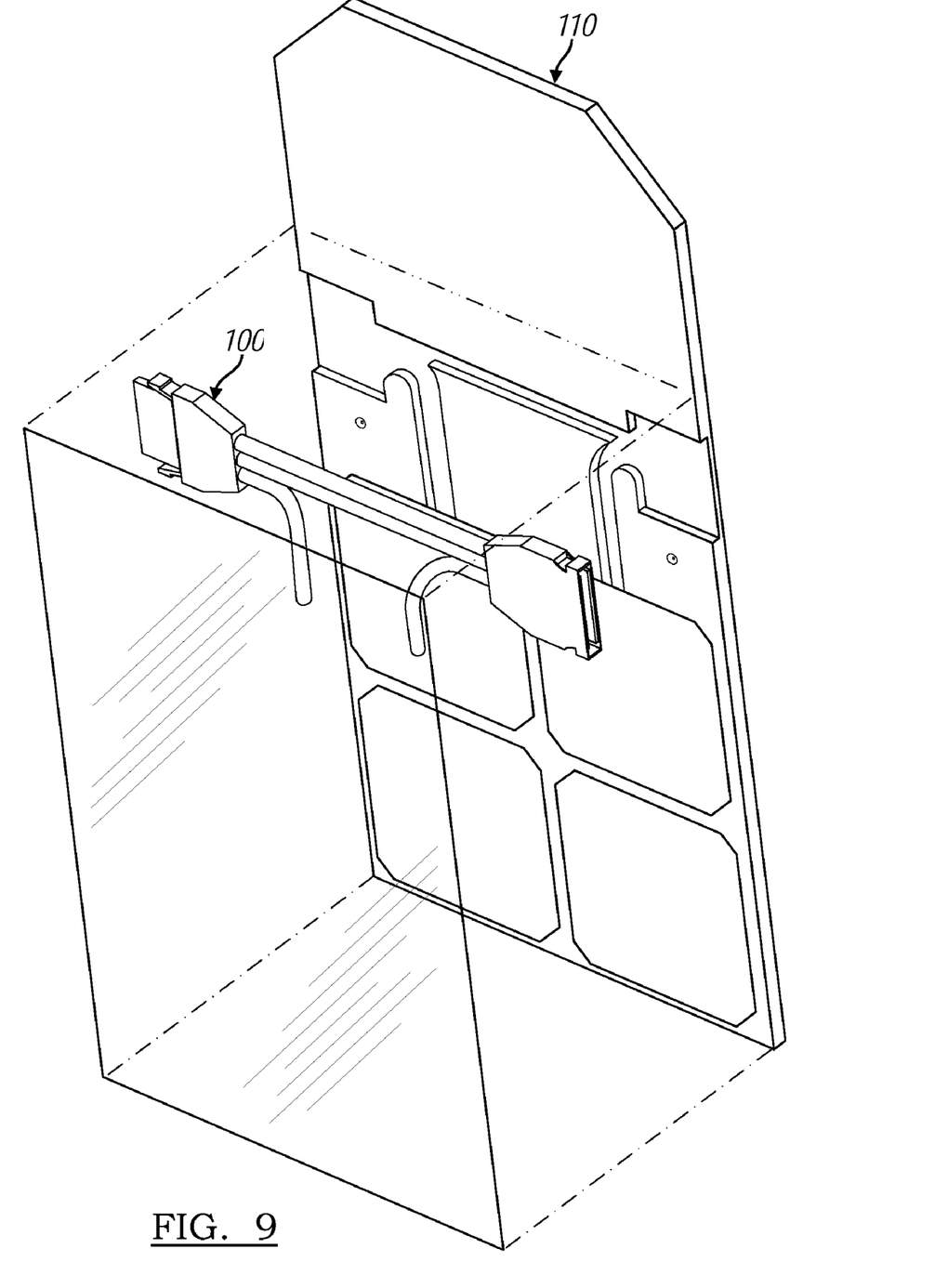
FIG. 9 is an exploded perspective view of FIG.7.
Figure 9A:
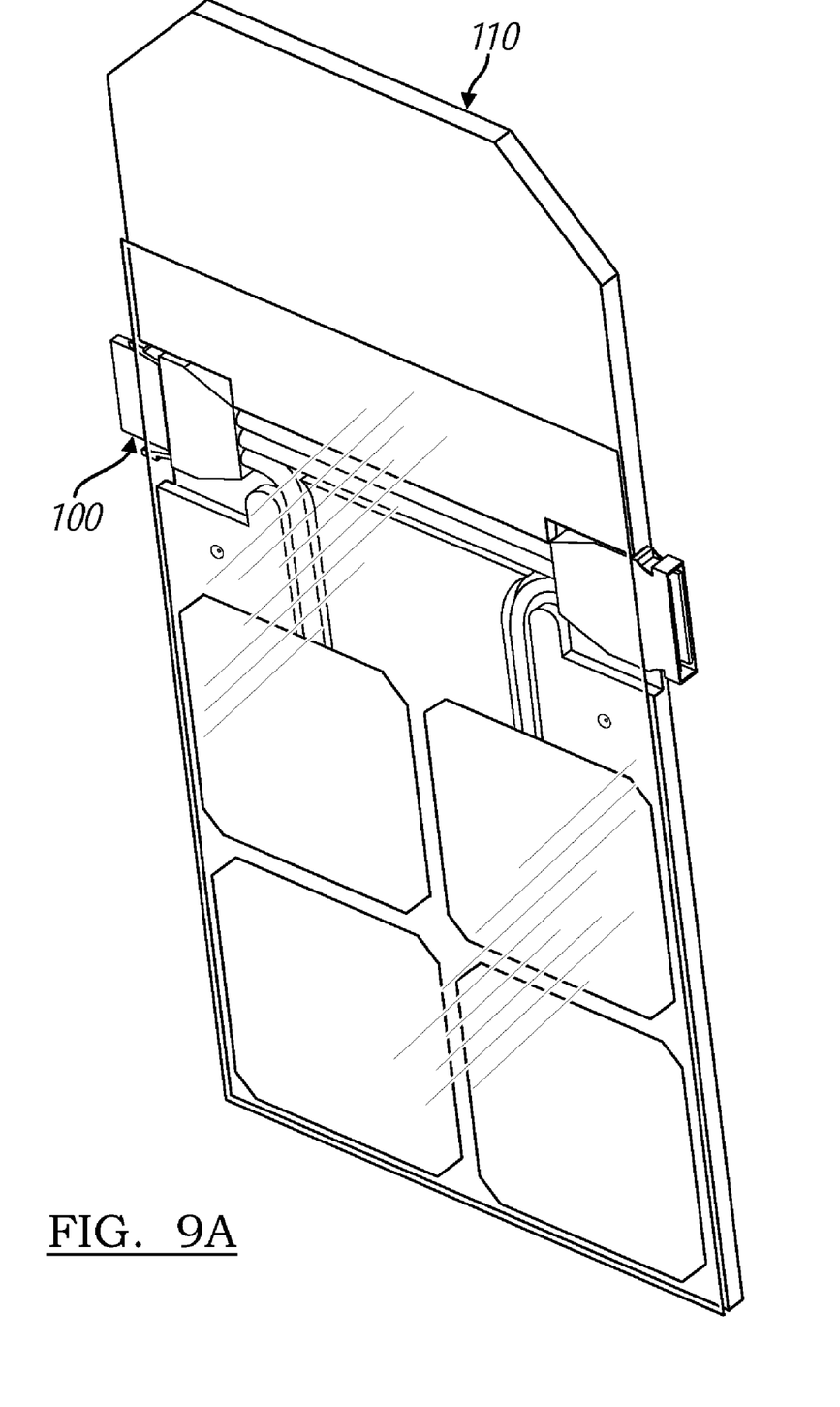
FIG. 9a is a perspective view of FIG. 7.

FIG. 8 discloses a terminus connector 5. In the preferred embodiment when the PV roofing tiles 110 are connected in arrays it will be necessary to provide a jumper wire between the negative solar cell lead wire 60 and the return line wire 30 in the very first PV roofing tile 110 of the array in order to close the circuit and generate electricity this accomplished by the terminus connector 5 which is configured to with either the female interconnect socket 20 or male interconnect plugs 10 previously disclosed. It will also be necessary to provide jumpers between end tiles in a multi-tiered array configuration.

FIG. 7 depicts the bottom plan view of several PV roofing tile 110 with the preferred embodiment of interconnect system 100 which comprises at least one low profile male interconnect plug 10 and at least one female interconnect or socket 20 that have a thickness or height less than 10 mm and are joined together by wires on their non-interlocking interfaces to compose a wiring harness or the interconnection system 100.

In this embodiment the interconnect system 100 is set into the PV roofing tile 110 by placement into grooves or channel 110 that are cut out into the substrate, or the inert or non solar collecting surface of the PV roofing tile 110, at a depth and width slightly deeper and wider than interconnect system 100. While the positive solar cell lead wire 50 or the negative solar cell lead wire 60 are fed through a hole in the PV roofing tile mold that will enable the wire to be electrically connected to the PV cells placed on the top side of the PV roofing tile 110. In one embodiment the interconnect system 100 is encapsulated and laminated to the tile, so that the bottom or rear face of the PV roofing tile 110 is a flat, smooth homogeneous surface that will lay flat on roofing decks eliminating the need for special decking for installation as well as having a low impact aesthetics. This also serves to provide a lower cost PV roofing tile system than the current available technology alternative. It also causes the male interconnect plug 10 and the female interconnect socket 20 to be rigidly fixed in relation to the vertical side edge or perimeter of the PV roofing tiles 110 wherein the female interconnect socket 20 is seated with a slight overhang that serves as a spacer between adjacent PV roofing tiles 110. When the male interconnect plug 10 is snapped in place, the electrical connection between the two connectors will be solid, the seal between male and female connectors will be closed, and the spacing between the vertical side edges of adjacent PV roofing tiles 110 will be uniform, between 4 mm and 9 mm in width in one embodiment, while the spacing can be increased or decreased dependent on the effect and tile used.

Figure 1:
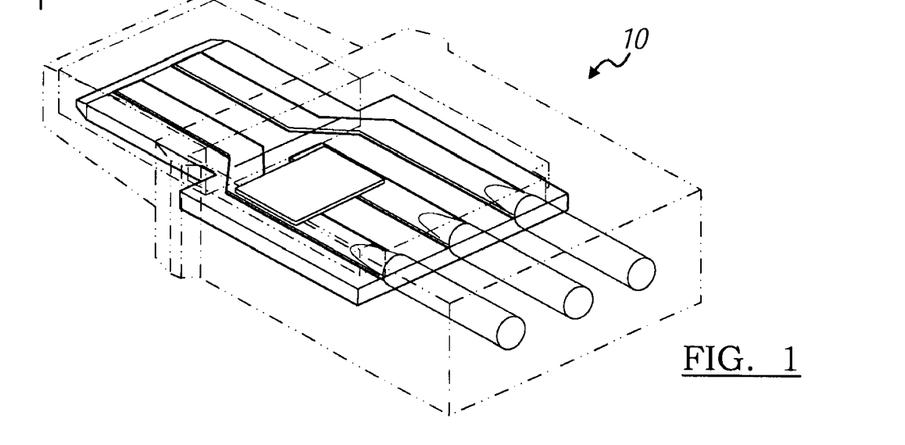
FIG. 1 is an unhidden line front perspective view of the male portion of the low profile interconnect.
Figure 1A:
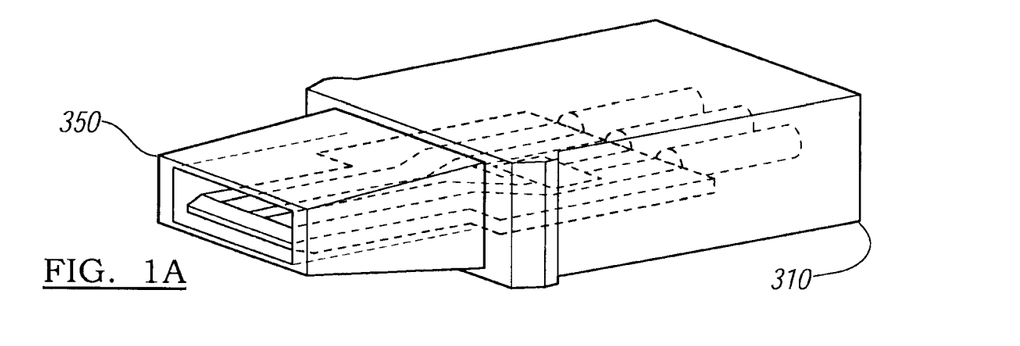
FIG. 1a is a rearward perspective view of the male portion of FIG. 1
Figure 2:
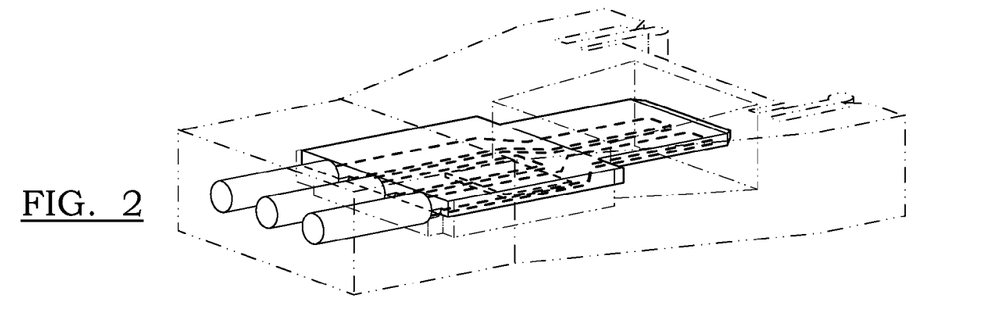
FIG. 2 is an unhidden line rearward perspective view of the female socket portion of the low profile interconnect.
Figure 2A:
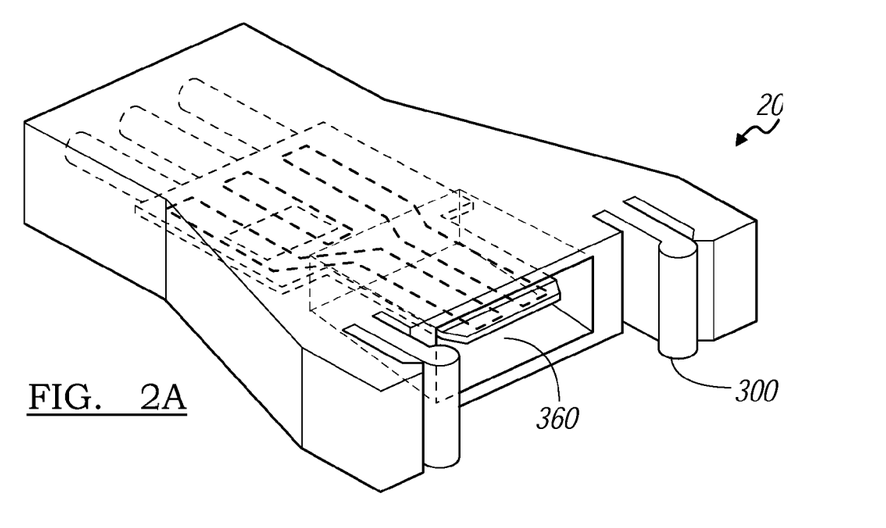
FIG. 2a is a forward perspective view of FIG. 2.
Figure 2B:
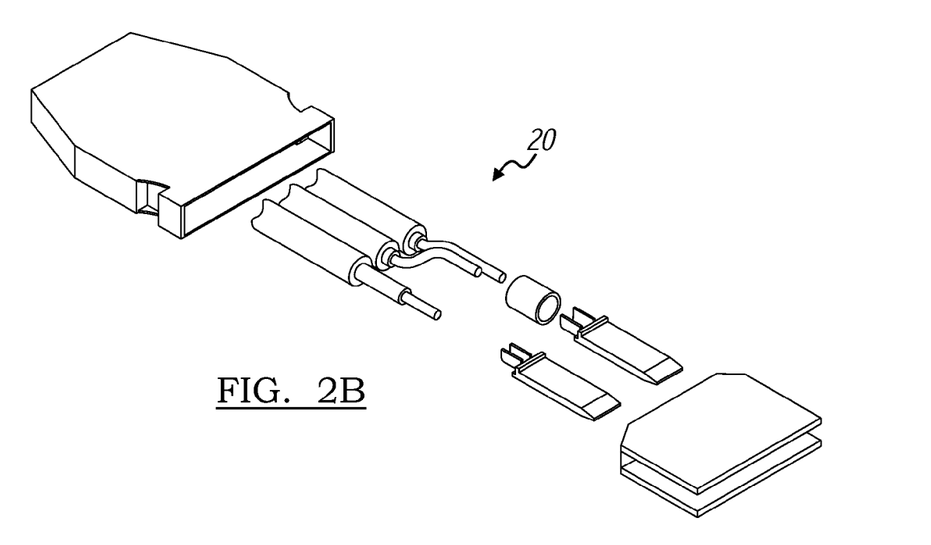
FIG. 2b is an exploded view of an alternate embodiment of the female socket portion of the low profile interconnect.
Figure 4:
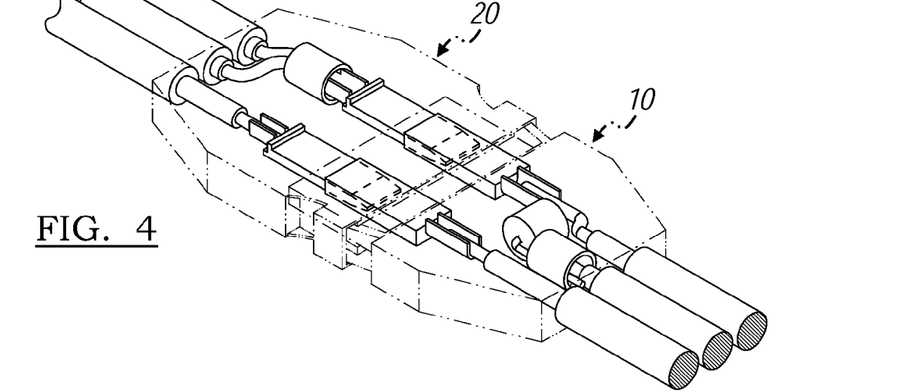
FIG. 4 is an unhidden line perspective view of the male and female portions partially interlocked.
Figure 4A:
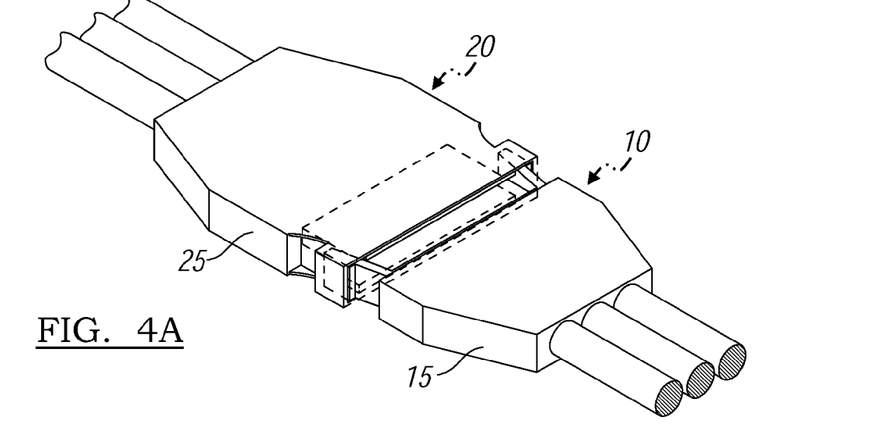
FIG. 4a is a perspective view of the male and female portions partially interlocked.

FIG. 1 and FIG. 1a depict an embodiment of the male interconnect plug 10 in a perspective view. While FIG. 2 and FIG. 2a depict an embodiment of the female interconnect plug 20 with the snapping or locking mechanism 300 exposed. FIGS. 4 and 4a depict the coupling of the female interconnect socket 20 and the male interconnect plug 10 whereby the male plug 10 will slide into the female socket 20 and snap in place. The snapping or locking mechanism 300 serves to firmly hold the interface between the two parts, ensuring a good electrical connection as well as maintaining a securely tight seal between the interfaces of the connectors. The secure seal protects the electrical connection from the elements. The snapping clips or locking mechanism 300 holds the male interconnect plug 10 in place by protrusions, shaped extensions, or gripping ridges 310 from its sidewalls. It is further contemplated that the locking mechanism may vary in size and location for example, the locking mechanism 300 can be located on either the socket or the plug.

Figure 5:
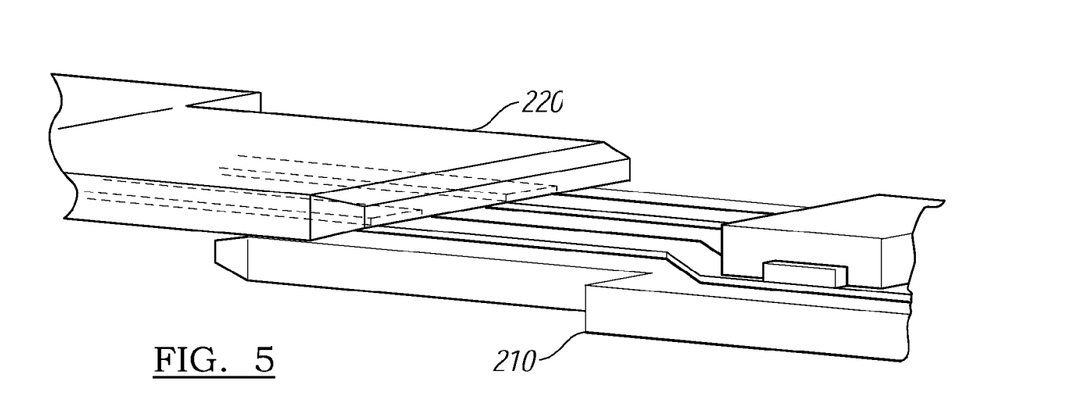
FIG. 5 is a schematic representation of FIG. 4
Figures 5A, 5B, 5C:
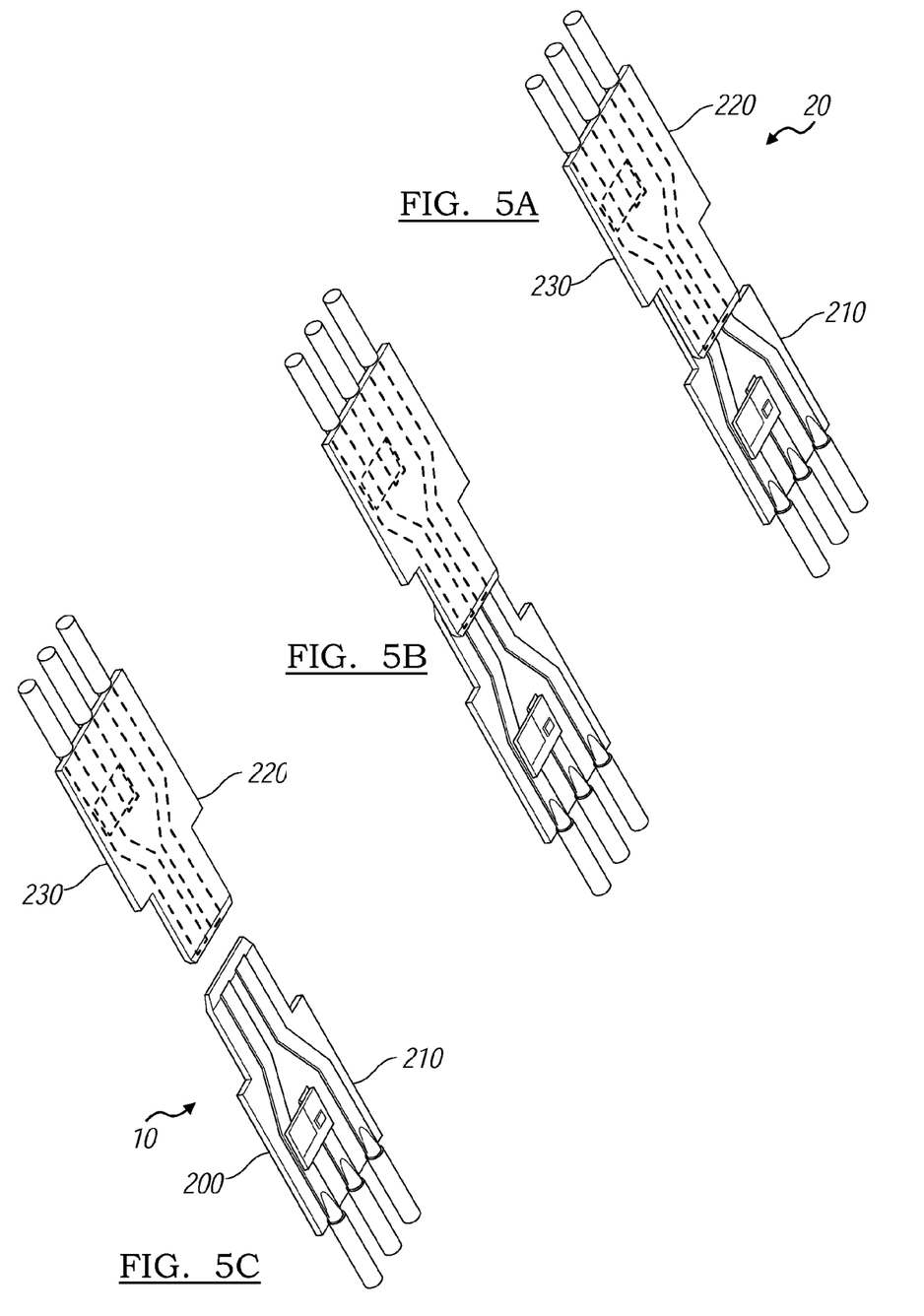
FIG. 5a is a schematic representation of FIG. 4 with integrated diode fully connected.
FIG. 5b is a schematic representation of FIG. 4 with integrated diode partially connected.
FIG. 5c is a schematic representation of FIG. 4 with integrated diode separated.
Figure 6:
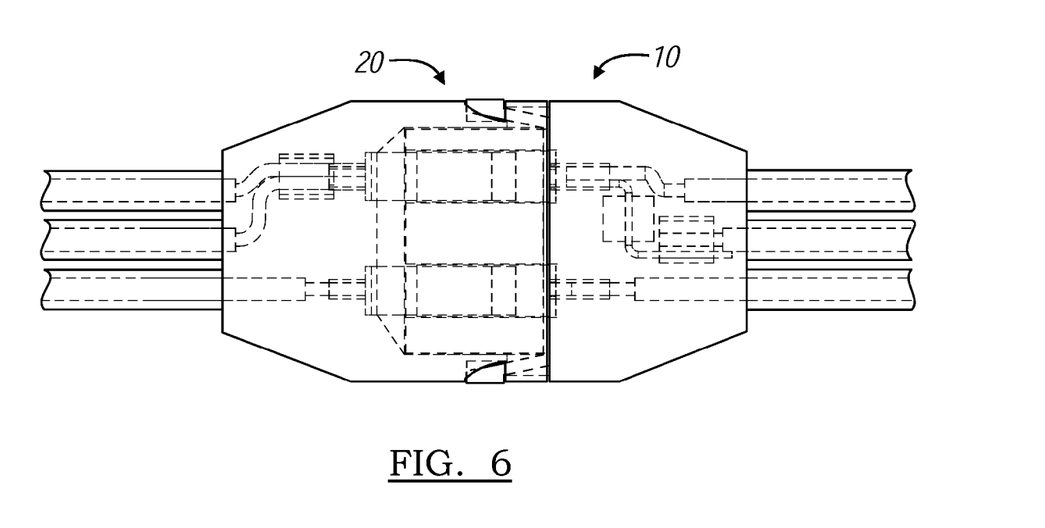
FIG. 6 is a top unhidden line plan view of the male and female portions of the interconnect fully coupled.
Figure 6A:
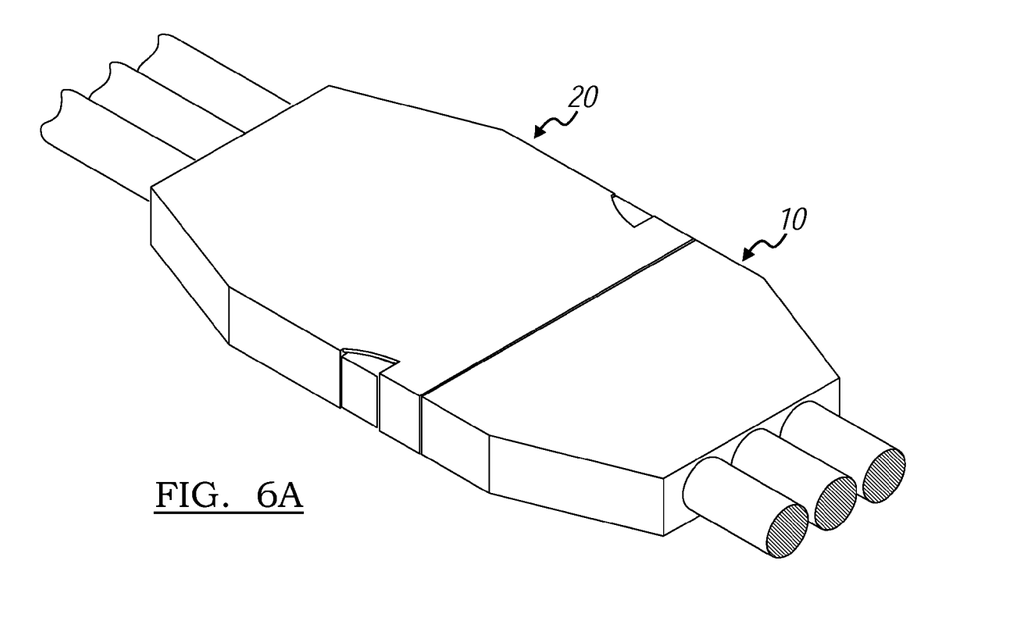
FIG. 6a is a top, side view of the male and female portions of the interconnect fully coupled.

FIG. 5a schematically depicts the preferred embodiment of the integration of a shunting or bypass diode 200 in the interconnect male plug 10, which allows for a modular PV roofing tile 110. In one embodiment, a surface mount shunting or bypass diode 200 is affix or soldered to a small printed circuit board 210 inside of the male connecting plug housing 15 which is intern electrically connected to wires 30,40 and 50. The shunting or bypass diode 200 is connected between the electrical paths of wires 50 and 40 with the anode of a rectifying shunting or bypass diode 200 is connected to the electrical path of bypass wire 40 with the cathode connected to the higher electrical potential side of the PV cell or in other words to the electrical path of the positive solar lead wire 50. This configuration will cause current to be diverted from the electrical path of the positive solar lead wire 50 to that of wire bypass wire 40 in the event of an impedance upsurge by shunting current around the PV roofing tile 110.

FIG. 5c schematically clearly portrays an embodiment with the printed circuit board 220 inside of the female socket housing 20 with a short 230 across the traces of the electrical path of wires 40 and 60 which shorts the "hot" line also referred to as wire 60 to provide an electrical current path to shunt current around the PV roofing tile 11 110 array in the event of a impedance upsurge in the PV 110 array has activated the shunting or bypass diode 200.

FIG. 5 schematically depicts the interconnection or coupling of the female socket 20 and the male interconnect plug 10 by showing the male circuit board 210 and the female circuit board 220, without their respective housings, which reveals that the two boards electrical contact point mirror of each other, so that when they are coupled the two traces are electrically connected. This unique concept reduces the complexity of manufacturing the connectors, by homogenizing the inner parts of each connector FIGS. 1a, 2a, 4a, and 4 taken collectively will clarify the assembly of an embodiment of the male interconnect plug 10 and the female interconnect socket 20. The male interconnect plug 10 has a positively tapered connecting protrusion 350 that increases in circumferential area from front to back, while the female interconnect socket 20 has a tapered connecting void 360 that decreases in circumferential area from front to back at inverse angles to that of the male interconnect plug 10.

When the front end of the female interconnect socket 20 and the male interconnect plug 10 are first pressed together, there is initially a small gap between the two circuit boards 220 and 210. As the two are pressed firmly together the ramping interface between the two parts caused by the tapered angles facilitates a smooth, unobstructed reduction of this gap into a good electrical connection while minimizing abrasive damage to the circuit boards. The taper also minimizes the space between the connector housings preventing wiggle in the connector interface forming a tight seal resistant to the elements. The locking mechanism 300 prevents accidental separation of the connectors.

Figure 1B:
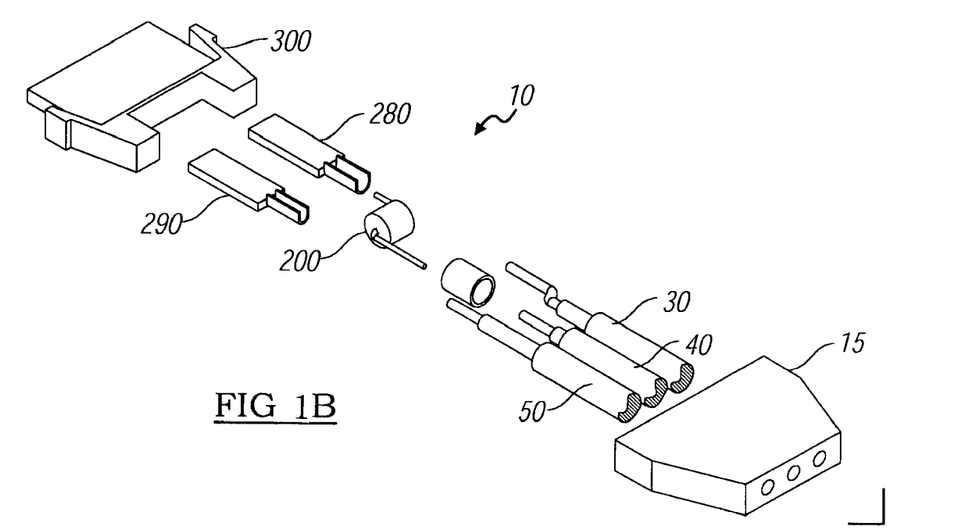
FIG. 1b is an exploded view of an alternate embodiment of the male portion of the low profile interconnect

FIG. 1b is an exploded view of an alternate embodiment of male interconnect plug 10 wherein thin sheets of sheet metal 290 replace the circuit board and traces to create the interconnection between the PV roofing tiles. The female interconnect socket, not shown in this view would have a similar configuration.

The invention has been described in terms of the preferred embodiment. One skilled in the art will recognize that it would be possible to construct the elements of the present invention from a variety of means and to modify the placement of the components in a variety of ways. While the embodiments of the invention have been described in detail and shown in the accompanying drawings, it will be evident that various further modifications are possible without departing from the scope of the invention as set forth in the following claims.

We claim:

1. A low profile photovoltaic (PV) roofing interconnect system comprising:
   at least one water proof PV roofing tile with a top portion containing a photovoltaic cell, a bottom portion, two opposing horizontal side edges, and two opposing vertical side edges;
   a low profile male interconnect plug positioned at and embedded in one of said vertical side edges, facing away from the center portion of said PV roofing tile;
   a low profile female interconnect socket positioned at and embedded in the second vertical side edge opposite of said male interconnect plug facing away from the center portion of said tile; and
   a plurality of wires electrically connecting said PV roofing tile and male interconnect plug and said female interconnect socket embedded in said PV roofing tile forming top and bottom portions that are smooth and flat.

2. The low profile PV roofing interconnect system of claim 1, wherein said low profile male interconnect plug comprises:
   a positively tapered connecting protrusion;
   a locking mechanism; and
   an internal circuit board incorporating a bypass diode.

3. The low profile PV roofing interconnect system of claim 1, wherein said low profile female interconnect socket comprises:
   a negatively tapered connecting void;
   a locking mechanism; and
   an internal circuit board creating a short circuit between two of the wires.

4. The low profile PV roofing interconnect system of claim 1, wherein said low profile male interconnect plug and said low profile interconnect socket uniformly extend slightly beyond said vertical side edges of the PV roofing tile.

5. The low profile PV roofing interconnect system of claim 1, wherein said low profile male interconnect plug and said low profile female interconnect socket each have a height less than around 10 mm.

6. The low profile PV roofing interconnect system of claim 1, wherein a plurality of said PV roofing tiles are connected in series forming an array.

7. The low profile PV roofing interconnect system of claim 1, wherein said low profile male interconnect plug and said low profile female interconnect socket are compatibly tapered forming a good electrical connection between said circuit boards as well as a seal against the elements.

8. The low profile PV roofing interconnect system of claim 1, wherein said male interconnect plug and said female interconnect socket utilize sheet metal contacts.

9. The low profile PV roofing interconnect system of claim 1, wherein said male interconnect plug and said female interconnect socket are so configured and dimensioned as to prevent insertion of a human finger in them.

10. The low profile PV roofing interconnect system of claim 1, wherein at least one said female interconnect socket has a jumper wire installed to complete the circuit.

11. The low profile PV roofing interconnect system of claim 1 further comprising a terminus connector mated with either the female interconnect socket or male interconnect plug to create an electrical circuit.

12. A low profile PV roofing interconnect system comprising:
   at least one PV roofing tile comprising a top portion, a bottom portion, two horizontal side edges, two vertical side edges said top portion comprising a photovoltaic member with a positive lead wire and negative lead wire said top portion comprising a water-proof roofing material and said bottom portion comprising grooves or channels parallel to said horizontal edges extending form traversing the width of said roofing tile;
   a low profile male interconnect plug positioned at one of said side vertical edges, facing away from the center portion of said roofing tile embedded in said bottom portion channel so that said bottom portion forms a smooth flat surface, comprising a plug housing forming a protrusion with locking mechanism and electrical contacts and a diode;
   a low profile female interconnect socket positioned at the other vertical side edge directly opposite of said male interconnect plug facing away from the center portion of said tile embedded in said bottom portion so that said bottom portion forms a smooth flat surface comprising a socket housing forming a void with locking mechanism and electrical contacts that form a short between two of the wires; and
   a plurality of wires electrically connected to said PV roofing tile comprising a return line wire, a bypass wire, and positive and negative lead wires connecting said male interconnect plug and said female interconnect socket similarly embedded in said bottom portion so that said bottom portion is a smooth flat surface.

13. The low profile PV roofing interconnect system of claim 12, wherein said low profile male interconnect plug and said low profile interconnect socket uniformly extend slightly beyond said vertical side edges of the PV roofing tile.

14. The low profile PV roofing interconnect system of claim 12, wherein said low profile male interconnect plug and said low profile female interconnect socket each have a height less than around 10 mm.

15. The low profile PV roofing interconnect system of claim 12, wherein a plurality of said PV roofing tiles are connected in series forming an array.

16. The low profile PV roofing interconnect system of claim 12, wherein said low profile male interconnect plug and said low profile female interconnect socket are compatible and form a good electrical connection between said contacts as well as a seal against the elements.

17. The low profile PV roofing interconnect system of claim 12, wherein said male interconnect plug housing is large enough to provide an air space to help cool said bypass diode.

18. The low profile PV roofing interconnect system of claim 12, wherein said male interconnect plug and said female interconnect socket are so configured and dimensioned as to prevent insertion of a human finger in them.

19. The low profile PV roofing interconnect system of claim 12 further comprising a terminus connector mated with either the female interconnect socket or male interconnect plug to create an electrical circuit.

20. A low profile PV roofing interconnect system comprising:
a plurality of wires for electrically connecting PV roofing tiles in series with a positive lead wire, a negative lead wire, a return wire and a bypass lead wire connected to a low profile male interconnect plug containing a bypass diode between the positive lead and the bypass lead and a low profile female interconnect socket with a short between the positive lead and the return wire suitable for imbedding into a roofing tile without increasing the thickness of the tile and providing a uniform gap between adjacent tiles.

21. The low profile PV roofing interconnect system of claim 20 further comprising a terminus connector mated with either the female interconnect socket or male interconnect plug to close the electrical circuit formed by the PV roofing tile.

* * * * *